(12) United States Patent
Stayt, Jr. et al.

(10) Patent No.: US 11,658,059 B2
(45) Date of Patent: May 23, 2023

(54) THIN MATERIAL HANDLING CARRIER

(71) Applicant: II-VI Delaware, Inc., Wilmington, DE (US)

(72) Inventors: John W. Stayt, Jr., Schnecksville, PA (US); Thomas Barrie, Annandale, NJ (US); Raven Persaud, Old Bridge, NJ (US); Garrett Korpinen, Bethlehem, PA (US); Geoffrey Robert Hale, Darlington (GB)

(73) Assignee: II-VI Delaware, Inc., Wilmington, DE (US)

( * ) Notice: Subject to any disclaimer, the term of this patent is extended or adjusted under 35 U.S.C. 154(b) by 1075 days.

(21) Appl. No.: 16/285,387

(22) Filed: Feb. 26, 2019

(65) Prior Publication Data

US 2019/0267276 A1    Aug. 29, 2019

Related U.S. Application Data

(60) Provisional application No. 62/636,320, filed on Feb. 28, 2018.

(51) Int. Cl.

| H01L 21/687 | (2006.01) |
| H01L 21/683 | (2006.01) |
| H01L 23/544 | (2006.01) |
| H01L 21/673 | (2006.01) |
| H01L 21/67 | (2006.01) |

(52) U.S. Cl.
CPC .. *H01L 21/68735* (2013.01); *H01L 21/67294* (2013.01); *H01L 21/67346* (2013.01); *H01L 21/6838* (2013.01); *H01L 21/68721* (2013.01); *H01L 21/68728* (2013.01); *H01L 23/544* (2013.01); *H01L 2223/54426* (2013.01)

(58) Field of Classification Search
CPC .......... H01L 21/6715; H01L 21/67294; H01L 21/67346; H01L 21/6836; H01L 21/6838; H01L 21/68721; H01L 21/68728; H01L 21/68735; H01L 23/544; H01L 2223/54426
USPC ......... 269/8, 289 R, 903; 451/283, 284, 285, 451/286, 287, 288
See application file for complete search history.

(56) References Cited

U.S. PATENT DOCUMENTS

| 5,703,493 | A | * | 12/1997 | Weeks | ..................... | G01R 1/04 |
| | | | | | | 324/754.03 |
| 6,084,494 | A | * | 7/2000 | Chew | ................ | H01L 21/68778 |
| | | | | | | 335/283 |
| 6,168,668 | B1 | * | 1/2001 | Yudovsky | ............... | H01L 21/68 |
| | | | | | | 118/728 |
| 6,662,950 | B1 | | 12/2003 | Cleaver | | |

(Continued)

*Primary Examiner* — Saul Rodriguez
*Assistant Examiner* — Brendan P Tighe
(74) *Attorney, Agent, or Firm* — Wendy W. Koba

(57) ABSTRACT

A wafer carrier that exhibits a thin, low-profile includes a bottom support plate upon which a thinned semiconductor wafer may be positioned, with a holding ring disposed to surround the periphery of the wafer and engage with the bottom support plate to hold the wafer in a fixed position between the two components. The bottom support plate is formed to include a plurality of apertures for pulling a vacuum through the carrier, as well as features that engage with the holding ring and alignment fiducials for properly registering the orientation of the wafer's surface with respect to the wafer carrier and other testing equipment using the wafer carrier.

17 Claims, 5 Drawing Sheets

(56) References Cited

U.S. PATENT DOCUMENTS

| | | | |
|---|---|---|---|
| 6,758,339 | B2 | 7/2004 | Simpson et al. |
| 8,146,902 | B2 | 4/2012 | Cheng et al. |
| 8,556,079 | B2 | 10/2013 | Pylant et al. |
| 8,813,964 | B2 | 8/2014 | Pylant et al. |
| 9,543,175 | B2 | 1/2017 | Corbin et al. |
| 2002/0029963 | A1* | 3/2002 | Yoshioka ............. C25D 17/001 204/224 R |
| 2003/0114016 | A1 | 6/2003 | Tischler |
| 2003/0211813 | A1* | 11/2003 | Kassir ................... B24B 37/30 451/28 |
| 2011/0049087 | A1* | 3/2011 | Ferguson ............. B25B 11/002 29/559 |
| 2016/0108539 | A1* | 4/2016 | Yahagi ................ C25D 17/001 269/287 |
| 2019/0105689 | A1* | 4/2019 | Kubota .................... B08B 9/00 |
| 2019/0203373 | A1* | 7/2019 | Fujikata ............ H01L 21/67288 |

\* cited by examiner

THIN MATERIAL HANDLING CARRIER

CROSS-REFERENCE TO RELATED APPLICATIONS

This application claims the benefit of U.S. Provisional Application No. 62/636,320, filed Feb. 28, 2018 and herein incorporated by reference.

TECHNICAL FIELD

The present invention relates to the processing of relatively thin (e.g., less than about 100 μm) semiconductor wafers and, more particularly, to a handling carrier that is able to support such a thin wafer in a stable configuration as it is transported from one location to another.

BACKGROUND OF THE INVENTION

The processing of III-V semiconductor wafers eventually results in the formation of a very thin multi-layer structure, on the order of about 90-100 μm in thickness. These wafers may comprise laser diodes (such as vertical cavity surface-emitting lasers—VCSELs) formed on wafers such as GaAs, InP, GaN, and the like). Without any means of support (or special processing), a thin wafer will tend to bow and/or warp as a function of the difference in tensile/compressive strength between the multiple layers. This thin wafer needs to handled for various follow-on processing steps, such as inspection, testing, and the like. The thin wafer needs to be flat for shipping, testing, and inspecting. The need to continuously re-flatten a thinned wafer during handling further stresses the wafer, which may cause the wafer to cleave (i.e., breaks through several layers, while remaining "hinged" by a metal layer) or ultimately break.

The thin wafer is also susceptible to breakage from debris accumulation on the wafer, particularly the backside. Turning a wafer to inspect the backside may result in breakage from the torque applied to the wafer while turning it over. Debris on the back of the wafer leads to breakage from stress nucleation when the wafer is flattened—either mechanically or with a vacuum (for example, from the chuck used for wafer diesort testing).

Temperature cycling during tests can also lead to cleaving and subsequent breakage from thermal expansions stresses. While it is possible to remove the vacuum during temperature cycling, this will allow the wafer to spring back into the undesired bow shape (which also leads to breakage).

Thus, a need remains for a simple, yet stable, protective covering for handling these wafers to as to minimize breakage and damage in the steps between fabrication and dicing.

SUMMARY OF THE INVENTION

The needs remaining in the prior art are addressed by the present invention, which relates to the processing of relatively thin (e.g., less than about 100 μm) semiconductor wafers and, more particularly, to a handling carrier that is able to support such a thin wafer in a stable configuration as it is transported from one location to another.

In particular, the present invention is directed to a wafer carrier that exhibits a thin, low-profile of separable components, including a bottom support plate upon which a thinned semiconductor wafer may be positioned, with a holding ring disposed to surround the periphery of the wafer. The holding ring engages with the bottom support plate to hold the wafer in a fixed position between the two components. The bottom support plate is formed to include a plurality of apertures for pulling a vacuum through the carrier. The apertures are specifically arranged to align with apertures of standard vacuum-assisted testing/inspection apparatus (e.g., a vacuum chuck).

In specific embodiments where a bottom surface of the thin wafer is metallized and electrical testing of this surface is required, the bottom support plate may itself be formed of an electrically conductive material so as to permit the testing to be performed without requiring the wafer to be removed from the carrier. Temperature cycling testing may also be facilitated through the use of a conductive bottom support plate.

Various types of alignment fiducials may be formed on both the bottom support plate and holding ring to assist in properly orienting the wafer with the carrier, as well as then properly aligning the carrier itself with testing equipment.

When utilized to support extremely fragile material, a releasable adhesive (e.g., tape, spray-on, etc.) may be applied to the bottom support plate prior to positioning the fragile material on the support plate.

Certain embodiments may also include the utilization of a clamp ring, positioned over the holding ring and used to ensure that the wafer remains in place as the carrier is transported from one location to another, or placed upon or removed from a selected piece of testing equipment.

Identification material may be imprinted or otherwise formed on the inventive wafer carrier and utilized as part of an inventory/quality control process to assist in tracking the location of a particular wafer with the need to include any such markings on the wafer itself.

An exemplary embodiment of the present invention takes the form of wafer carrier comprising a bottom support plate (upon which a wafer may be positioned). The bottom support plate includes a plurality of apertures formed therethrough, the apertures for pulling a vacuum force and maintaining the mounted wafer in place during subsequent operations. The wafer carrier further comprises a holding ring disposed to surround the periphery of the positioned wafer and engage with the bottom support plate to hold the wafer in a fixed position between the bottom support plate and the holding ring.

Another embodiment of the present invention may take the form of a carrier for transporting fragile material having a thickness no greater than 100 μm. In this embodiment, the carrier comprises a bottom support plate upon which the fragile material may be placed and a holding ring disposed to surround the periphery of the fragile material and engage with the bottom support plate to hold the fragile material in a fixed position between the bottom support plate and the holding ring. The bottom support plate is specifically formed to include a plurality of apertures formed therethrough, the apertures for pulling a vacuum force and maintaining the fragile material in place during subsequent operations.

Other and further aspects and embodiments of the present invention will become apparent during the course of the following discussion and by reference to the accompanying drawings.

BRIEF DESCRIPTION OF THE DRAWINGS

Referring now to the drawings, where like numerals represent like parts in several views.

DESCRIPTION OF THE INVENTION

The present invention relates to an improved wafer carrier structure that is specifically configured to handle relatively thin wafers (e.g., 90-100 μm or so), keeping the wafer flat during its handling during activities such as, testing, inspecting, shipping and the like. More generally, the present invention relates to a carrier structure that is useful for supporting and transporting any fragile material that is relatively thin (e.g., having a thickness of 100 μm or less). Thus, while the following discussion describes the use of the inventive carrier with a processed (and thinned) semiconductor wafer, and typically defines the inventive structure as a "wafer carrier", the general scope of the invention is not so limited.

In an exemplary embodiment, an inventive wafer carrier is a thin, low-profile configuration of separable components, comprising a bottom support plate upon which a thinned semiconductor wafer is placed, with a holding ring positioned to surround the periphery of the wafer and engage with the bottom support plate to hold the wafer in a fixed position. The bottom support plate is formed to include a plurality of apertures for pulling a vacuum through the carrier, as well as features that engage with the holding ring. The holding ring is preferably formed of an ESD-safe material so as to not interfere with the properties of the wafer. Advantageously, the use of separate components to form the carrier allows for them to be dis-engaged from one another and thoroughly cleaned of accumulated debris between uses. The wafer carrier of the present invention may be utilized to flatten and hold a thin wafer as soon in the fabrication process as possible, where the wafer thereafter remains in the carrier until diced into separate components.

Figure 1:
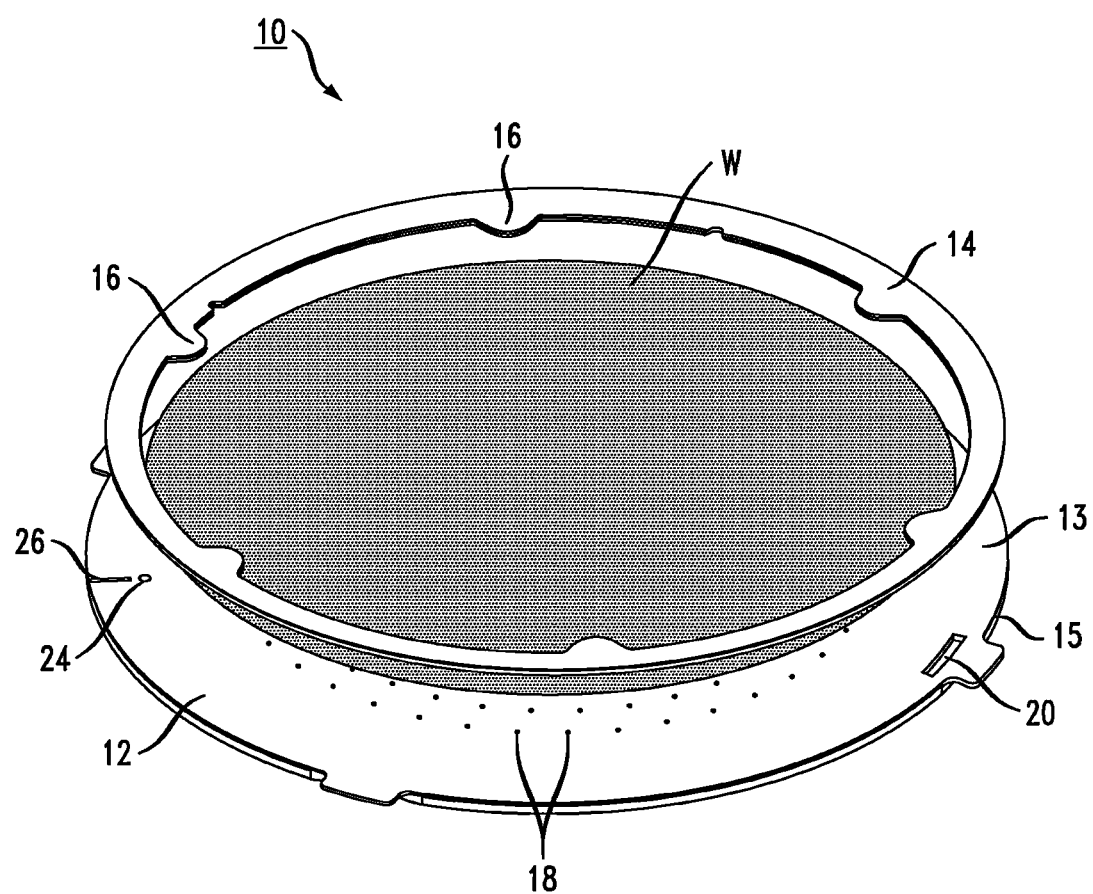
FIG. 1 is an exploded view of an exemplary wafer carrier formed in accordance with the principles of the present invention.

FIG. 1 is an exploded isometric view of an exemplary wafer carrier 10 formed in accordance with the principles of the present invention to securely hold a thinned epitaxial wafer (e.g., thickness between about 90 and 100 μm) during post-fabrication operations. As shown, wafer carrier 10 comprises a bottom support plate 12 and a holding ring 14. A thinned wafer W is also shown in FIG. 1, as positioned between bottom support plate 12 and holding ring 14. As mentioned above, it is to be understood that the utilization of carrier 10 to support a semiconductor wafer is only an exemplary embodiment and that carrier 10 may be used to support (and transport) any type of thin, fragile material.

Continuing with reference to FIG. 1, bottom support plate 12 is formed to include a plurality of apertures 18 that allow for an applied vacuum force (such as from a vacuum chuck utilized as a component in testing/inspection equipment) to hold wafer W in place against bottom support plate 12. The flatness of top surface 13 of bottom support plate 12 is important to maintain the thermal and optical quality of wafer W when carrier 10 is placed on a standard vacuum chuck of a wafer prober (for testing, for example). Preferably, this flatness of top surface 13 is in the range of ±5 μm or less. Holding ring 14 is formed to include a plurality of inwardly-directed tabs 16, which are sized to contact an outer peripheral region of wafer W and assist in maintaining the wafer in place between bottom support plate 12 and holding ring 14.

Also shown in FIG. 1 is an engagement slot 20 that is formed in bottom support plate 12, where engagement slot 20 mates with a protrusion 22 formed on the underside of holding ring 14 (see FIG. 5, discussed below). Preferably, at least two such slots 20 and protrusions 22 are formed, as illustrated in the following drawings. The engagement of slots 20 with protrusions 22 is used to prevent holding ring 14 from moving (i.e., rotating) with respect to bottom support plate 12, where any rotational movement of holding ring 14 with respect to bottom support plate 12 may otherwise damage a peripheral area of wafer W. At least one alignment fiducial 24 is formed on top surface 13 of bottom support plate 12, located at an area near the outer periphery of bottom support plate 12, as shown in FIG. 1. Alignment fiducial(s) 24 is(are) used to provide for registration between a wafer W (i.e., an alignment notch on wafer W) and bottom support plate 12 and create the proper orientation between wafer W and carrier 10. Also shown in FIG. 1 is a slot 26 formed adjacent to an alignment fiducial 24 and extending outward to the edge 15 of bottom support plate 12. In use, an alignment notch in wafer W is oriented to align with slot 26, where slot 26 is used to extend the orientation of wafer W to external equipment (such as a wafer prober used to test the operability of the individual devices formed on the wafer), with slot 26 providing coarse alignment between the prober and the wafer's surface. It is to be understood that in most cases the robotics and vision system of the prober will thereafter perform final alignment of the wafer to the probe needles.

Figure 2:
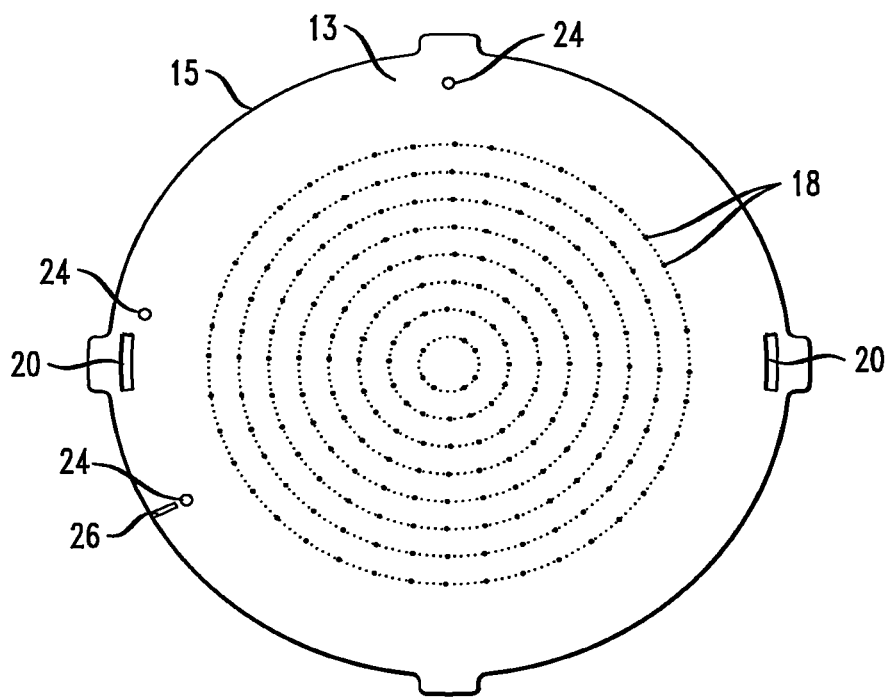
FIG. 2 is a top view of an exemplary bottom support plate component of the inventive wafer carrier of FIG. 1.

FIG. 2 is a top view of bottom support plate 12, looking down at top surface 13 of bottom support plate 12. The complete plurality of apertures 18 is visible in this view. In this particular configuration, the plurality of apertures 18 is arranged in a pattern of concentric circles, where the spacing between adjacent apertures along a given circle, as well as the spacing between adjacent circles, is defined to coordinate with the arrangement of vacuum apertures on conventional wafer chucks used in testing/inspection equipment. Also evident in this view is the pair of engagement slots 20 and a set of alignment fiducials 24. Alignment slot 26 is shown as extending outward from one of these alignment fiducials 24. While not particularly illustrated in FIG. 2, various other slots, grooves, and/or recesses may be formed around the periphery of top surface 13 to facilitate automated wafer handling involving wafer loading equipment and systems.

Figure 3:
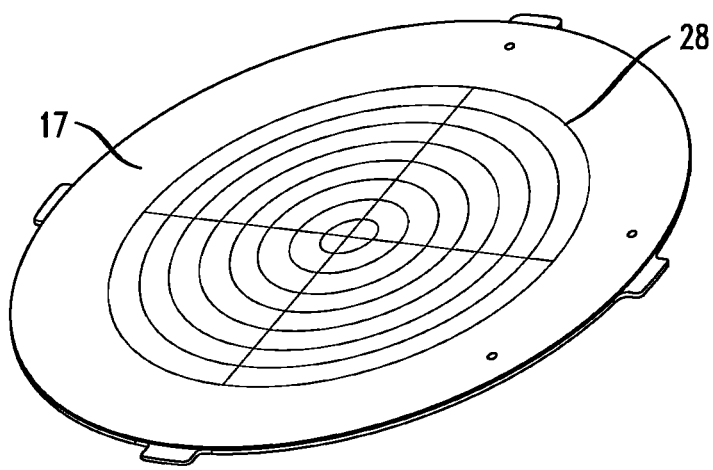
FIG. 3 is an isometric view of the underside of the bottom support plate of FIG. 2.

FIG. 3 is an isometric view of the underside of bottom support plate 12. As shown in this view, bottom support plate 12 is preferably formed to further include registration grooves 28 on its underside surface 17 that will mate with similar alignment fiducials on a conventional wafer chuck to ensure that wafer W is properly positioned and oriented prior to performing any type of testing. As mentioned above, alignment between plate 12 and the wafer chuck is necessary so that the vacuum apertures of the chuck properly align with apertures 18 of plate 12. The vacuum supplied by the wafer chuck will pull down on wafer W through apertures 18 to hold wafer W securely in place, remaining motionless during testing. While not explicitly shown, it is to be understood that in some configurations the underside of bottom support plate 12 may comprise a central recessed area (for example) that is able to index to a specific type of vacuum chuck that is formed to include a raised vacuum area (i.e., a type of pedestal arrangement).

In accordance with one or more embodiments of the present invention, bottom support plate 12 may be formed of a metal (such as aluminum or steel), or other electrically conductive material, and exhibits a surface with a flatness variation of only a few microns (e.g., ±5 µm or so). The use of a metal (conductive) material for bottom support plate 12 is advantageous for applications where an electrical testing contact to a metal layer on a bottom surface of the wafer is required. The presence of a conductive bottom support plate may also facilitate temperature-related testing. The use of a metal for bottom support plate 12 allows for the application of electrical test signals to wafer W, as well as for temperature cycling testing to be performed, by virtue of the efficient heat transfer properties of the metal. As mentioned above, temperature cycling during testing has been found in the prior art to lead to cleaving and subsequent breakage (from the thermal expansion stresses). In accordance with the properties of the carrier of the present invention, the wafer chuck's vacuum force may be turned off during thermal testing, without worry that the wafer will move, where the removal of the vacuum allows for the expansion/contraction of the wafer, as discussed above. Once the thermal testing is completed, the vacuum may easily be re-established via apertures 18 in bottom support plate 12.

For situations where there is no need to provide such a conductive member, bottom support plate 12 may be formed of an insulative material, such as a ceramic, or a hybrid of a metal and insulator to isolate the wafer from the wafer prober (testing device) for best noise performance. In yet another embodiment, a plating consisting of, for example, one or more layers of a nano-coating, a metal, ceramic or powder coating may be applied to bottom support plate 12 for electrical and thermal conductivity, as well as to prevent oxidation or rusting.

Figure 4:
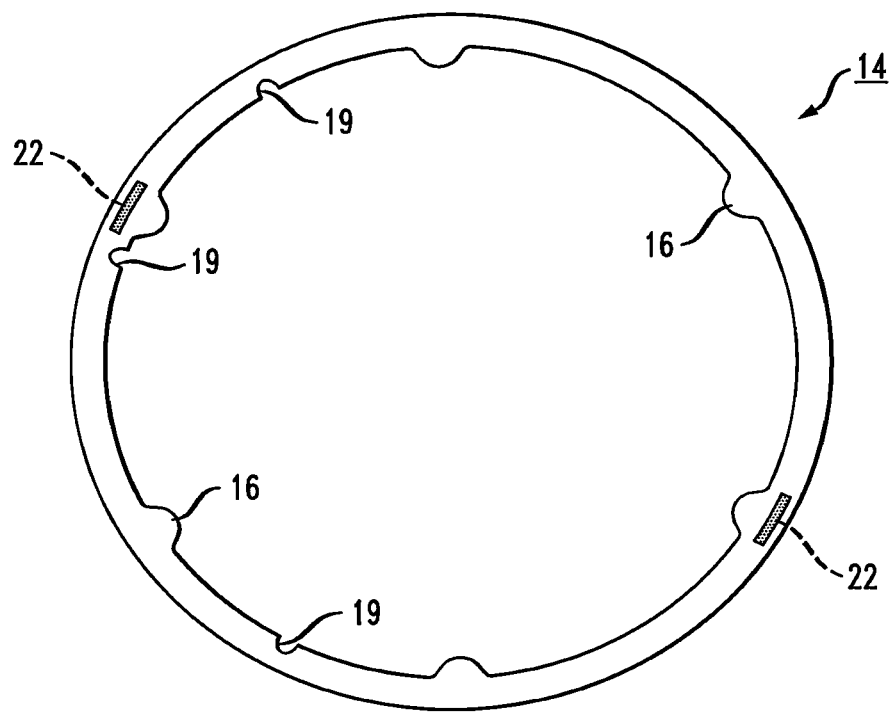
FIG. 4 is a top view of an exemplary holding ring component of the inventive wafer carrier of FIG. 1.

FIG. 4 is a top view of holding ring 14, showing the set of inwardly-facing tabs 16. The location of protrusions 22 (see FIG. 5) are indicated by rectangular shaded areas in FIG. 4. Also evident in this view is a set of notches 19 disposed at predetermined locations that will match up with alignment fiducials 24 formed on top surface 13 of bottom support plate 12. The use of these alignment features provides further assurances that the supported wafer W will be properly oriented within testing/inspection equipment as needed.

Figure 5:
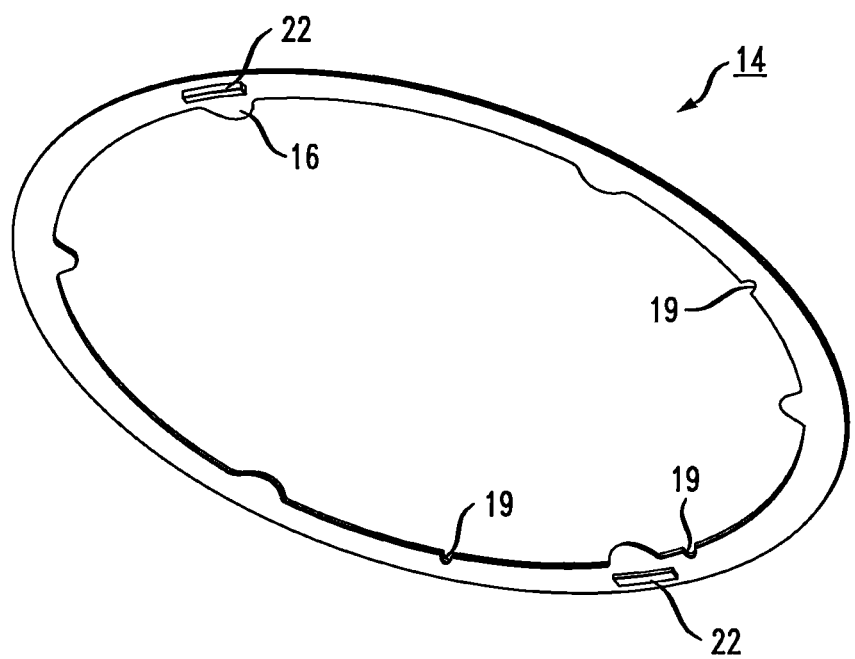
FIG. 5 is an isometric view of the underside of an exemplary holding ring component of the inventive wafer carrier.

FIG. 5 is an isometric view of the underside of an exemplary holding ring 14, formed in accordance with one or more embodiments of the present invention. Protrusions 22 (which mate with slots 20 on bottom surface plate 12) are clearly shown in this view.

Holding ring 14 is preferably formed of an electro-static-discharge (ESD)-free material, such as polypropylene (for example) to prevent ESD damage to wafer W. Other suitable material choices are possible. Holding ring 14 is formed to be relatively thin, while still retaining a thickness sufficient to provide a clamping force (via tabs 16) on wafer W. While being sufficient to provide "fixation", in one or more embodiments holding ring 14 may be configured to allow for wafer W to expand and/or contract (in the direction of the wafer surface) to release thermal mismatch expansion/contraction associated with the different materials forming wafer W. Indeed, the ability to control the "release" of the thermal stresses is an advantage of the carrier configuration of the present invention and functions to reduce cleavage and/or breaking of wafers during testing. In some embodiments (when used in conjunction with a metallic bottom support plate), holding ring 14 may be further configured to include one or magnets to provide an additional degree of fixation between bottom support plate 12 and holding ring 14. In general, the materials selected for bottom support plate 12 and holding ring 14 may be tailored to match the CTE of the chuck upon which the carrier will be mounted for testing.

Figure 6:
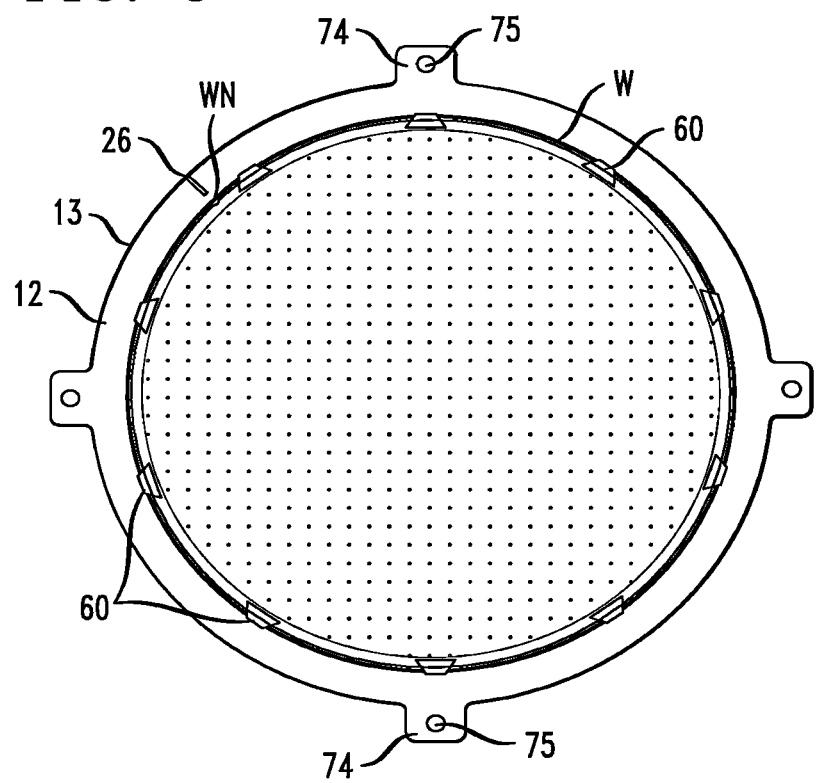
FIG. 6 illustrates an alternative configuration of the embodiment of FIG. 1, where in this case an additional adhesive is used to secure a fragile wafer (or other fragile item) to the bottom support plate.

There are known to be extremely fragile materials such as, for example, thinned semiconductor substrates of GaAs, InP, and GaN (as well as graphene, carbon fiber, nano-materials, and intrinsically-conductive polymers) that require extra care when being positioned within a wafer carrier formed in accordance with the present invention. In particular, there are situations where it has been found advantageous to also utilize a type of releasable adhesive to position the fragile material on bottom support plate 12. Acceptable releasable adhesives include, for example, UV-releasable tape, adhesive tape, and adhesive spray. The tape may be disposed as individual segments around an area of bottom support plate, or may take the form of a ring. FIG. 6 illustrates an exemplary configuration where a plurality of tape segments 60 are positioned between bottom support plate 12 and wafer W.

Figure 7:
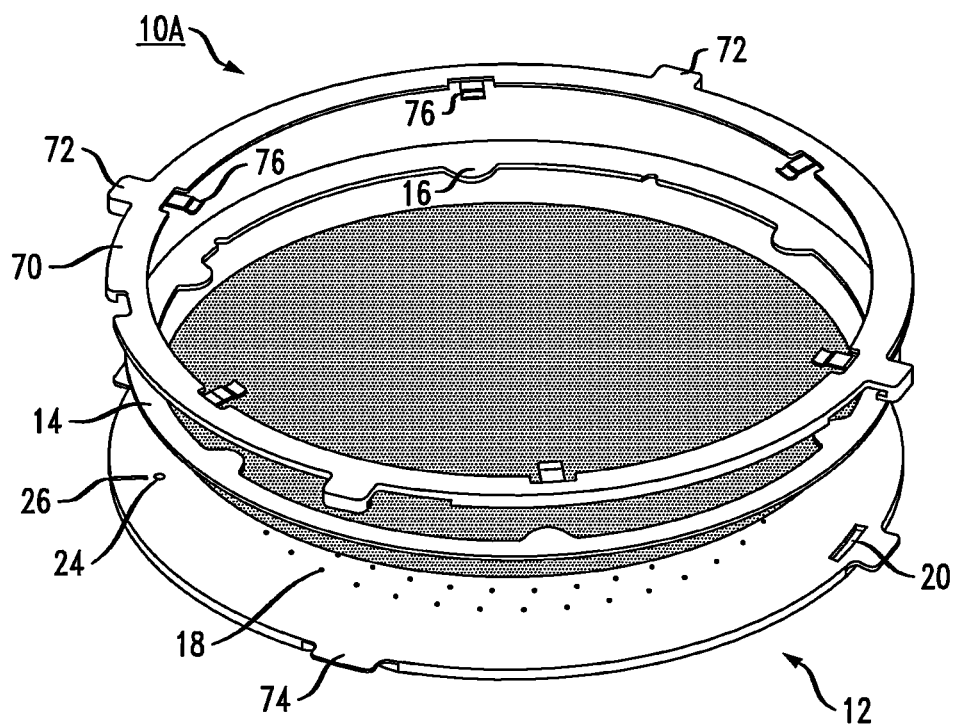
FIG. 7 is an exploded view of an alternative embodiment of the present invention, in this case utilizing a clamp ring in combination with the bottom support plate and holding ring shown in FIG. 1.

FIG. 7 illustrates an alternative embodiment of the present invention. Shown as wafer carrier 10A, this embodiment further comprises a clamp ring 70 that is positioned over holding ring 16 and engages with bottom support plate 12 in a manner that secures the three separate components together. Indeed, clamp ring 70 provides further assurance that wafer W will be retained in place against bottom support plate 12, particularly as carrier 10 is handled to move the wafer from one testing/inspecting location to another. In the embodiment shown in FIG. 7, clamp ring 70 includes a set of clips 72 disposed around its outer periphery, where clips 72 engage with a plurality of tabs 74 formed on bottom support plate 12 to hold the components of carrier 10 together. Various other mechanisms may be used to provide the attachment of the stack of components (i.e., support plate 12, holding ring 14, clamp ring 70). For example, a magnetic attachment configuration may be used for this purpose. Reference is made to the illustration of bottom support plate 12 as shown in FIG. 6, where tabs 74 are also shown. Here, each tab includes a through-hole 75 that will align with an associated pin on a vacuum chuck, providing further assurance of alignment and orientation of wafer W with respect to the testing/inspection equipment.

Clamp ring 70 is shown as further comprising a set of clamping pins 76 that are disposed around the inner periphery of clamp ring 70 and provide a spring-tension force against wafer W to hold it fixedly in place. In certain embodiments, clamping pins 76 may be designed to retract when a feature on clamp ring 70 is rotated. Alternatively, clamping pins 76 may be formed to slide in and out. These features of pins 76 are useful for configurations where the material of the wafer is too delicate for clamping. Indeed, the sliding pins can be used in conjunction with clamp ring 16 to establish the initial retention of wafer W within carrier 10.

Figure 8:
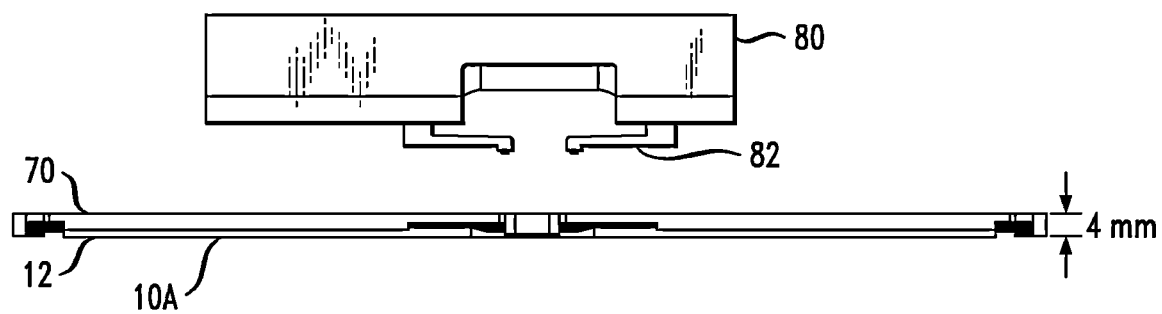
FIG. 8 illustrates an exemplary arrangement of the inventive wafer carrier in use with associated testing equipment.

It is to be understood that the wafer carrier of the present invention itself must also be relatively thin (i.e., exhibit a "low profile") so that it does not interfere with testing probes/needles that need to contact the top surface of the wafer as it is held in the carrier. FIG. 8 illustrates an exemplary arrangement of carrier 10A with a wafer prober 80, where the test probe/needles 82 are shown. In use, these needles 82 need to be lowered onto the top surface of the wafer. Thus, the addition of the holding ring and clamp ring must be thin enough to not affect the ability of the needles to reach the wafer surface. In one embodiment, carrier 10 exhibits a profile on the order of a few millimeters (e.g., about 4 mm or so). In particular, there are situations where it has been found advantageous to utilize a type of releasable adhesive (as described above in association with FIG. 6) to position fragile material on bottom support plate 12 while also achieving the desired low profile for the carrier itself.

Figure 9:
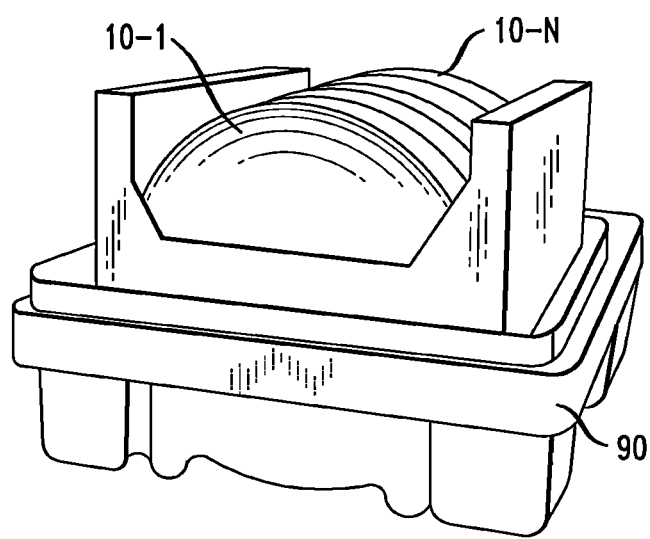
FIG. 9 shows a common container for holding a plurality of the inventive wafer carriers.

Additionally, the thin profile of the inventive wafer carrier allows for the storage of multiple carriers (each supporting a separate wafer) in a common wafer container. FIG. 9 shows a common container 90, holding a plurality of inventive, low-profile carriers 10-1 through 10-N.

Moreover, another advantage of the inventive wafer carrier is the ability to utilize an identification system to uniquely identify the carrier and, additionally uniquely identify a pairing of a specific wafer to a specific wafer carrier. For example, a unique ID number may be formed on carrier 10 (for example, on underside 17 of bottom support plate 12) and used for tracking and inventory purposes. A label, stamping, or laser-scribing technique may be used to form the identification.

Although the foregoing invention has been described in some detail for the purposes of clarity of understanding, it will be apparent that certain changes and modifications may be practiced within the scope of the appended claims. Accordingly, the present embodiments are to be considered as illustrative and not restrictive, and the invention is not limited to the details given herein, but may be modified within the scope and equivalents of the appended claims.

What is claimed:

1. A wafer carrier comprising
    a bottom support plate upon which a wafer may be positioned, the bottom support plate including a plurality of apertures formed therethrough, the apertures for pulling a vacuum force and maintaining the wafer in place during subsequent operations;
    a holding ring disposed to surround the periphery of the wafer and engage with the bottom support plate to hold the wafer in a fixed position between the bottom support plate and the holding ring; and
    a clamp ring disposed over the holding ring, the clamp ring configured to engage with the bottom support plate and secure an included wafer disposed therebetween, wherein the clamp ring further comprises a plurality of pins disposed around the inner periphery thereof and formed to contact outer areas of the included wafer and provide additional secure positioning of the included wafer within the wafer carrier.

2. The wafer carrier as defined in claim 1, wherein
    the bottom support plate further comprises at least one longitudinal slot in proximity to a peripheral edge location; and
    the holding ring further comprises at least one engagement protrusion for mating with the at least one longitudinal slot to provide engagement between the bottom support plate and the holding ring, preventing rotation of the holding ring with respect to the bottom support plate.

3. The wafer carrier as defined in claim 1 wherein the bottom support plate further comprises at least one alignment fiducial formed at a defined location at a peripheral edge location, the at least one alignment fiducial providing registration between a mounted wafer and the bottom support plate.

4. The wafer carrier as defined in claim 3 wherein the bottom support plate further comprises at least one alignment slot extending outward from the at least one alignment fiducial, the at least one alignment slot for providing positioning of the wafer carrier with respect to external testing equipment.

5. The wafer carrier as defined in claim 1 wherein the bottom support plate further comprises at least one registration element formed on a bottom surface thereof, the at least one registration element providing alignment between the wafer carrier and external testing equipment such that vacuum apertures of the external testing equipment align with the plurality of apertures formed in the bottom support plate, providing an effective vacuum force to secure the included wafer in place within the external testing equipment.

6. The wafer carrier as defined in claim 1 wherein the bottom support plate is formed of a conductive material for facilitating selected testing of an included wafer.

7. The wafer carrier as defined in claim 1 wherein the bottom support plate is formed of an insulating material.

8. The wafer carrier as defined in claim 1 wherein the holding ring further comprises a plurality of inward-facing tabs for contacting outer peripheral regions of the included wafer and securing placement of the included wafer.

9. The wafer carrier as defined in claim 1 wherein the holding ring is sized to allow expansion/contraction of an included wafer in the direction of the wafer surface, accommodating release of thermal stresses associated with coefficient of thermal expansion (CTE) between different layers forming the included wafer.

10. The wafer carrier as defined in claim 1 wherein in the holding ring comprises an electro-static-discharge (ESD)-free material.

11. The wafer carrier as defined in claim 1 wherein the wafer carrier further comprises a releasable adhesive disposed on peripheral portions of a top surface of bottom support plate to facilitate fixation of an included wafer to the bottom support plate.

12. The wafer carrier as defined in claim 1 wherein the clamp ring comprises magnetic components that mate with magnetic components formed in the bottom support plate to provide the engagement.

13. The wafer carrier as defined in claim 1 wherein the clamp ring comprises a plurality of clips disposed around the outer periphery thereof, wherein the bottom support plate further comprises a plurality of tabs disposed around the outer periphery thereof, the plurality of tabs positioned to engage with the plurality of clips to secure the attachment of the holding ring and the bottom support plate, with an included wafer disposed therebetween.

14. The wafer carrier as defined in claim 1 wherein the plurality of pins is retractable.

15. The wafer carrier as defined in claim 1 wherein an upper surface of bottom support plate maintains a flatness with a deviation of no greater than ±5 µm.

16. The wafer carrier as defined in claim 1 wherein the wafer carrier is configured to support wafers having a thickness no greater than 100 μm.

17. A carrier for transporting fragile material having a thickness no greater than 100 μm, the carrier comprising
- a bottom support plate upon which the fragile material may be placed, the bottom support plate including a plurality of apertures formed therethrough, the apertures for pulling a vacuum force and maintaining the fragile material in place during subsequent operations;
- a holding ring disposed to surround the periphery of the fragile material and engage with the bottom support plate to hold the fragile material in a fixed position between the bottom support plate and the holding ring; and
- a clamp ring disposed over the holding ring, the clamp ring configured to engage with the bottom support plate and provide additional fixation support for the fragile material positioned on the bottom support plate, wherein the clamp ring further comprises a plurality of pins disposed around the inner periphery thereof and formed to contact outer areas of the included wafer and provide additional secure positioning of the included wafer within the wafer carrier.

* * * * *